(12) United States Patent
Hannah et al.

(10) Patent No.: US 6,388,912 B1
(45) Date of Patent: *May 14, 2002

(54) QUANTUM MAGNETIC MEMORY

(75) Inventors: Eric C. Hannah, Pebble Beach, CA (US); Michael Brown, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/539,722

(22) Filed: Mar. 30, 2000

(51) Int. Cl.[7] .............................................. G11C 13/04
(52) U.S. Cl. ........................ 365/121; 365/118; 365/237
(58) Field of Search ................................ 365/121, 118, 365/237, 127, 128

(56) References Cited

U.S. PATENT DOCUMENTS

| | | | |
|---|---|---|---|
| 5,546,337 A | 9/1994 | Hurt et al. .................. | 365/121 |
| 5,604,706 A | 3/1995 | Hurt et al. .................. | 365/217 |
| 5,940,314 A | * 8/1999 | Suzuki et al. ............... | 365/121 |
| 6,034,887 A | * 3/2000 | Gupta et al. ................ | 365/171 |

OTHER PUBLICATIONS

F. J. Himpsel, et al., IBM Journal of Research & Development, "Electronic States in Magnetic Nanostructures", vol. 42, No. 1, 1998, 9 pages Available: http://www.research.ibm.com/journal/rd/421/himpsel.html.

D. Awschlom, University of California, Santa Barbara, "Working Group on Magnetism and Magnetic Material" 1998, 39 pages, Available:http://www–als.lbl.gov/als/workshops/scidirecthtml/4Magnetic/magnetic.html.

J. Pierre, et al., Laboratoire Louis Neel, CNRS, Grenoble, "Half Metallic Ferromagnets", 1998, 9 pages http://www.tcd.ie/Physics/People/Michael.Coey/oxsen/newsletter/january98/halfmeta.htm.

* cited by examiner

*Primary Examiner*—Huan Hoang
(74) *Attorney, Agent, or Firm*—Leo V. Novakoski (57) ABSTRACT

A system for storing data on a magnetic medium using spin polarized electron beams is provided. The system includes a source of spin polarized electrons and a storage medium disposed a selected distance from the source. The storage medium has a plurality of storage locations, each of which includes a layer of magnetic material sandwiched between first and second layers of a half-metallic material. The resulting sandwich structure forms a spin dependent electron trap that increases coupling between beam electrons in a first spin state and target electrons in a second spin state. An electron optics system directs the source of spin polarized electrons to one of the plurality of storage locations.

22 Claims, 9 Drawing Sheets

QUANTUM MAGNETIC MEMORY

BACKGROUND OF THE INVENTION

1. Technical Field

The present invention relates to memory systems and in particular to systems and methods for writing data to magnetic memory systems using spin-polarized electron beams.

2. Background Art

The predominant mass storage device in conventional computer system is the hard disk drive. Hard disk drives are relatively large, electromechanical devices that can store tens of gigabits of data. The stored data is accessed through a read/write head that rides on a cushion of air above the rapidly rotating disk. The read/write head moves radially to access data in different tracks of the rotating disk. Data transfer is limited by the speed at which the disc rotates and the speed with which the read/write head is positioned over the required track. Even with the fastest devices, access times are on the order of thousands of microseconds, due to the relatively large mechanical motions and inertia involved. This time scale is at least five orders of magnitude slower than the nanosecond time scales at which processors operate. The discrepancy can leave the processor starved for data.

One proposed data storage system that may provide both higher data densities and faster access times than currently available mass storage devices employs spin-polarized electrons to read data from and write data to a storage medium. Electron beams can be manipulated by charged-particle optics, which operate on time scales closer to those seen in processors. U.S. Pat. Nos. 5,546,337 and 5,64,706 describe systems that employ spin-polarized electrons to transfer data to and from a storage medium. The disclosed systems scatter spin-polarized electron beams from the magnetic moments associated with different storage locations on the medium to read data from and, arguably, to write data to these locations.

One problem with the disclosed system is that the characteristics of the storage media that provide desirable magnetic properties also make it difficult to alter these magnetic properties, i.e. a magnetic material, such as iron (Fe), deposited on a layer of a conductive, non-magnetic material. This combination of material layers creates a quantum well. Using a thin layer of magnetic material forces the easy axis of magnetization out of the plane of the magnetic layer. The resulting perpendicular magnetization supports denser packing of the magnetic domains that represent individual data bits, e.g. the storage locations.

The thin magnetic layer of a storage location is illuminated with a spin-polarized electron beam emitted from a source located as close as a few millimeters above the storage medium. The source-to-medium separation provides time and space to steer the beam to the targeted storage location. However, this geometry also delivers the beam electrons to the magnetic layer at normal or near normal angles of incidence, i.e. perpendicular to the thinnest dimension of the magnetic layer. The volume of the magnetic layer sampled by the electron beam ("interaction volume") is thus relatively small, and the number of electrons in the magnetic layer ("target electrons") to which the beam electrons couple is similarly small.

An additional problem is that electron beam sources produce electron energies of several tens of electron volts (eV). At these energies, the probability of an incident electron being bound by the quantum well formed by the magnetic layer is greatly reduced. The combination of the thin layer of magnetic material, the normally incident beam, and the high electron energy thus limits the strength of the coupling between the spin-polarized electron beam and the target electrons.

In order to flip the spin state associated with a storage location, the relative number of spin up and spin down electrons must be reversed before spin-relaxation mechanisms restore the status quo. In ferromagnetic materials, exchange interactions among the electrons make the dominant spin state more stable than the minority spin state. If a relatively small portion of the dominant spin electrons interact with the spin-polarized electron beam, any spin flipping triggered by the beam will be ameliorated by spin-relaxation mechanisms.

Effective spin flipping thus requires the incident beam of spin-polarized electrons to interact with a large number of electrons in the magnetic material (target electrons) over a relatively short time. The electron beam must effect a critical number of target electrons within a spin-relaxation time, or else the dominant spin state will reestablish itself.

Systems have been developed that allow the coupling between spin-polarized electrons and the target electrons in the magnetic material to reverse the majority spin state. For example, scanning tunneling microscopes (STMs) employ scanning tips that are positioned within a few Angstroms (Å) of the surface of the magnetic layer. The scanning tip may be modified to cause spin-polarized electrons to tunnel from the tip into the medium. STMs may emit electrons into the target material with energies substantially below 1 eV. As a result, the spin-polarized electrons tend to become trapped by the quantum well formed by the magnetic layer and move laterally along the layer, allowing each incident electron to couple to many target electrons before it exits the magnetic material. STM's can provide very high spin-polarized current densities, e.g. several micro amps per square nanometer. The combination of quantum well trapping and very high current density has been demonstrated to reverse the magnetic sense of a thin magnetic film.

The STM geometry and physical translation mechanism are not suitable for high performance storage media applications. For example, the close proximity of the scanning tip to the surface limits the area of the storage medium that may be scanned by deflecting the electron beam. In addition, STM scanning techniques translate the entire STM apparatus relative to the medium, making them too slow for processor applications.

The present invention address these and other problems associated with writing data to magnetic media using spin-polarized electron beams.

BRIEF DESCRIPTION OF THE DRAWINGS

The present invention may be understood with reference to the following drawings, in which like elements are indicated by like numbers. These drawings are provided to illustrate selected embodiments of the present invention and are not intended to limit the scope of the invention.

DETAILED DISCUSSION OF THE INVENTION

The following discussion sets forth numerous specific details to provide a thorough understanding of the invention. However, those of ordinary skill in the art, having the benefit of this disclosure, will appreciate that the invention may be practiced without these specific details. In addition, various well-known methods, procedures, components, and circuits have not been described in detail in order to focus attention on the features of the present invention.

The present invention provides a system for reading data from and writing data to a storage medium, using a beam of spin-polarized electrons. A system in accordance with the present invention employs a storage medium that promotes enhanced coupling between the spin-polarized electrons of the beam ("beam electrons") and the electrons of a magnetic layer in the storage medium ("target electrons"). Beam electrons of a particular spin polarization are preferentially trapped in a volume that includes the magnetic layer, allowing each beam electron to undergo energy transferring collisions with multiple target electrons having the opposite spin polarization.

The spin polarization of the beam electrons that are preferentially trapped is determined by the majority spin state of the electrons of the magnetic material at the target location (target electrons). This majority spin state determines the magnetic state of the location. The electron beam has a net polarization that is determined by the majority spin state of its component electrons (beam electrons). The magnetic state of a location may be flipped by illuminating the location with an electron beam having a net polarization (majority spin state) that is opposite to the majority spin state of the target electrons.

A storage medium in accordance with the present invention includes a magnetic material that is sandwiched between spin-mirror materials to form a spin-dependent electron trap. For one embodiment of the spin-dependent electron trap, a layer of a hard magnetic material is sandwiched between first and second layers of spin-mirror materials. Here, "layer" refers to one or more atomic layers, the actual number and composition of which may be varied to tune the properties of the spin-dependent electron trap.

The spin-mirror material is a magnetically polarizable material that is characterized by a relatively low density of electron states at its Fermi level for electrons in a first spin state and a relatively high density of states for electrons in a second, opposite spin state. This electronic structure increases the probability that an electron in the first spin state incident on the spin-mirror material will be reflected rather than transmitted through the spin-mirror material. In effect, the spin-mirror material provides spin-dependent transmission/reflection for electrons in a range of incident energies. While materials with greater than zero densities of states may be used for the present invention, they will not be as effective as those having zero densities of state, since the available states allow some leakage.

Electrons in the second spin state may be captured between the spin-mirror materials by injecting them into the spin-dependent electron trap at relatively high incident energies, i.e. energies above the Fermi level. Collisions between the incident electron and the electrons of the storage medium reduce the incident electron's kinetic energy to a range in which the spin-dependent transmission properties of the spin-mirror material become apparent. Providing magnetic material between the two layers of spin-mirror material allows each trapped electron to interact with many target electrons, as the beam electron is reflected between the two spin mirror layers. The resulting coupling facilitates flipping of the spin state of the magnetic material.

For one embodiment of the invention, the spin-mirror material may be a half metal. A typical half metal is a ferromagnetic material in which ferromagnetic decoupling shifts the energy levels for one spin state relative to those for the opposite spin state to provide the above described electronic structure. A half metal acts as an insulator to electrons in one spin state and a conductor to electrons in the other spin state.

For another embodiment of the invention, the magnetic material is a hard magnetic material and the spin-mirror material is a soft magnetic material. Here, hard and soft magnetic materials are materials having larger and smaller coercivities, respectively. Generally, soft magnetic materials have fewer minority spin electrons in the vicinity of the Fermi level. Strain induced in these materials under appropriate deposition conditions may perturb the electronic structure of these soft materials sufficiently to convert them into half-metallic materials or near half-metallic materials.

The increased coupling provided by the present invention allows the beam electrons in a specified spin state to transfer energy to a greater number of target electrons. The Pauli exclusion principle ensures that this energy is transferred preferentially to target electrons that have spin alignments opposite to the majority spin state of the beam electrons ("opposite spin electrons") over those that have the same spin alignments as the beam electrons ("same spin electrons"). The resulting spin-dependent energy transfer to the target electrons enhances the probability of preferential spin flipping, as discussed in greater detail below.

Figure 1A:
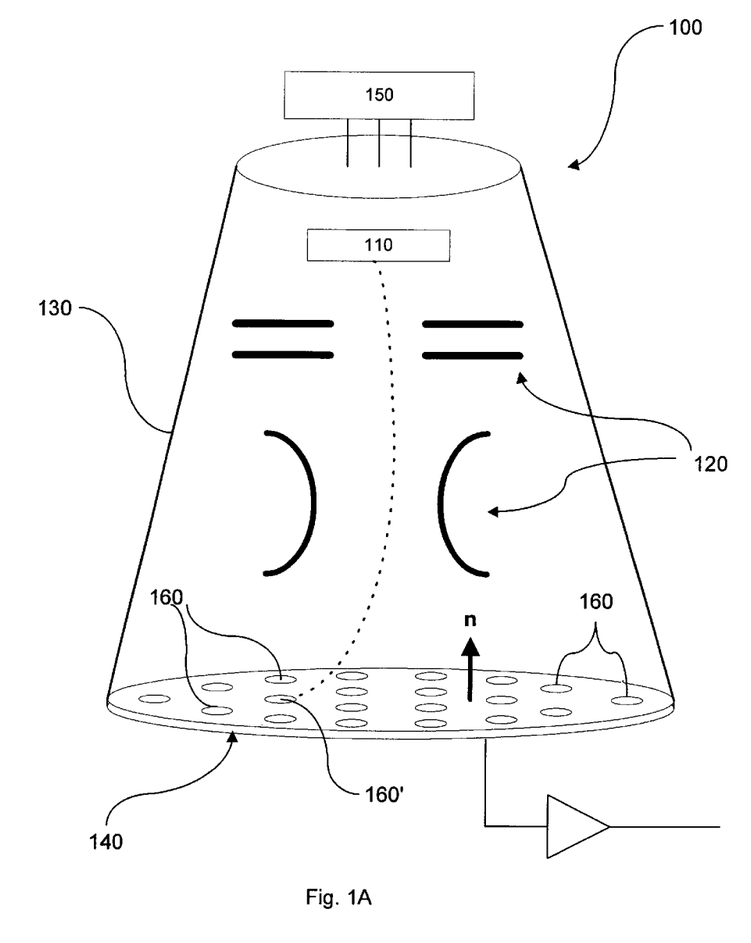
FIG. 1A is a schematic representation of a system for reading and writing magnetic media using a spin-polarized electron beam.

FIG. 1A is a schematic representation of a system 100 for reading and writing magnetic media 110 using a beam 112 of spin-polarized electrons. System 100 includes a source 110, an electron optic system 120, a vacuum housing 130, a storage medium 140 and a control module 150 for electron optics 120. Source 110 generates spin-polarized electrons, which are directed to selected storage locations 160 on storage medium 140, using electron optics 120. Suitable sources include, for example, electron beam micro-columns. Each location 160 on storage medium 140 may represent a data bit. In FIG. 1A, electron beam 112 is shown directed to read or write data at location 160'.

Each storage location 160 typically includes a magnetic material that may be magnetized in one of two orientations to represent a data bit in a high or low logic state. The two alignments of the magnetization are generally referred to as "spin-up" and "spin-down", but the actual direction of alignment depends on the structure of the storage medium. For high-density storage devices, the preferred alignments are parallel and anti-parallel to a surface normal vector (n).

Figure 1B:
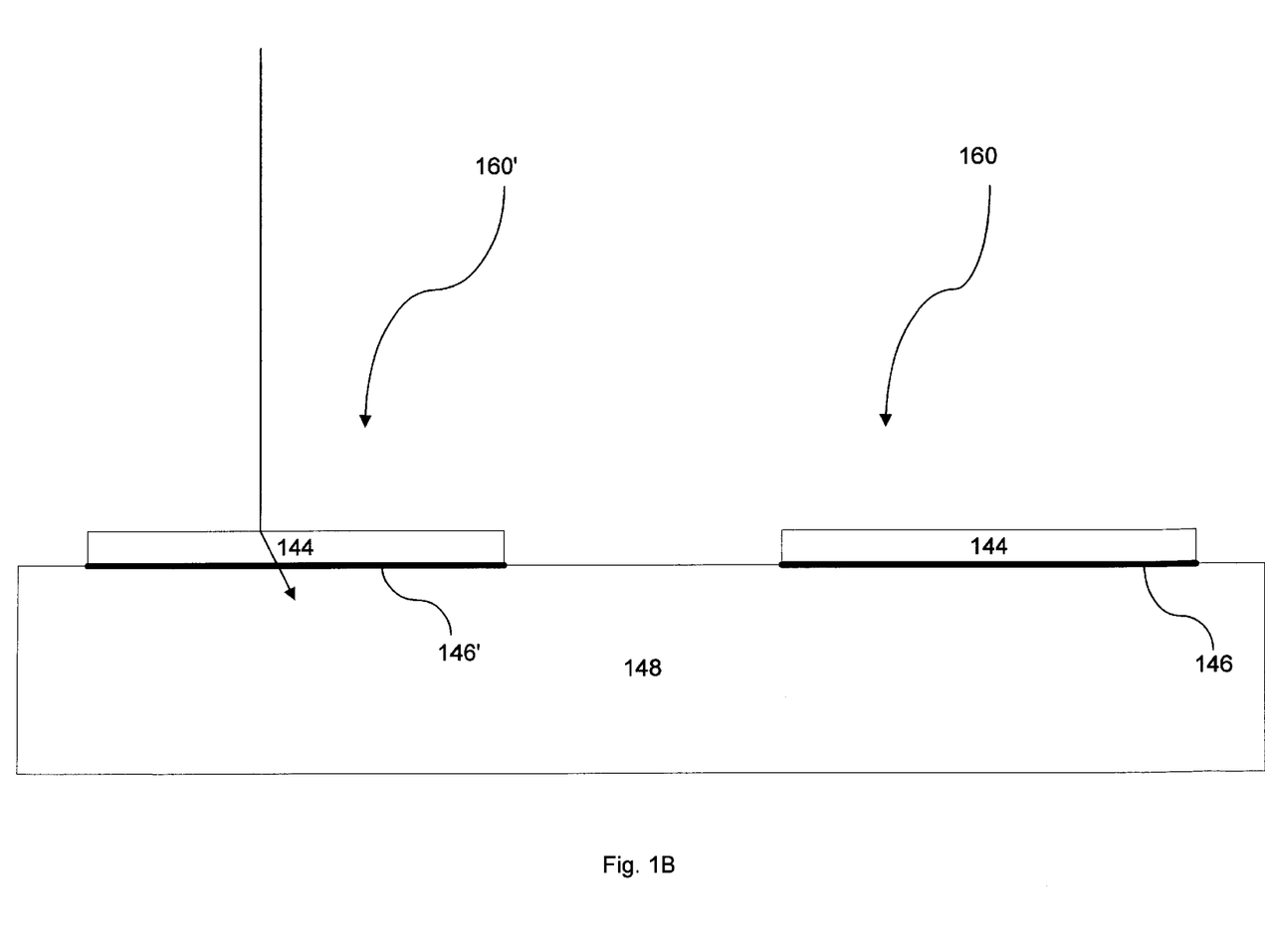
FIG. 1B is a block diagram of a conventional magnetic recording medium for use with the system of FIG. 1A.

FIG. 1B is a block diagram of an embodiment of a conventional storage medium 140 designed to provide magnetizations parallel or anti-parallel to surface normal n. Storage medium 140 includes a relatively thin layer of magnetic material 144 deposited on a conductive, non-magnetic material 148. The different crystal structures of magnetic material 144 and non-magnetic material 148 meet at a boundary 146. Strain between the different crystal structures at boundary 146 forces the easy axis of magnetization out of the plane magnetic layer 144. In addition, the discontinuity at interlayer boundary 146 creates a barrier that limits charge flow between the materials. Non-magnetic layer 148 is coupled to a sense amplifier, which may be used to "read" the logic state of a location 160 as it is illuminated with a spin-polarized electron beam 112. The sense amplifier detects the amount of current that passes through the magnetic layer rather than being reflected from the metallic layers. Spin-polarized electron beam 112 reads the logic state stored at one of locations 160 by taking advantage of the dependence of beam scattering behavior on the relative orientation of the beam and target electron spin polarizations.

Figure 2:
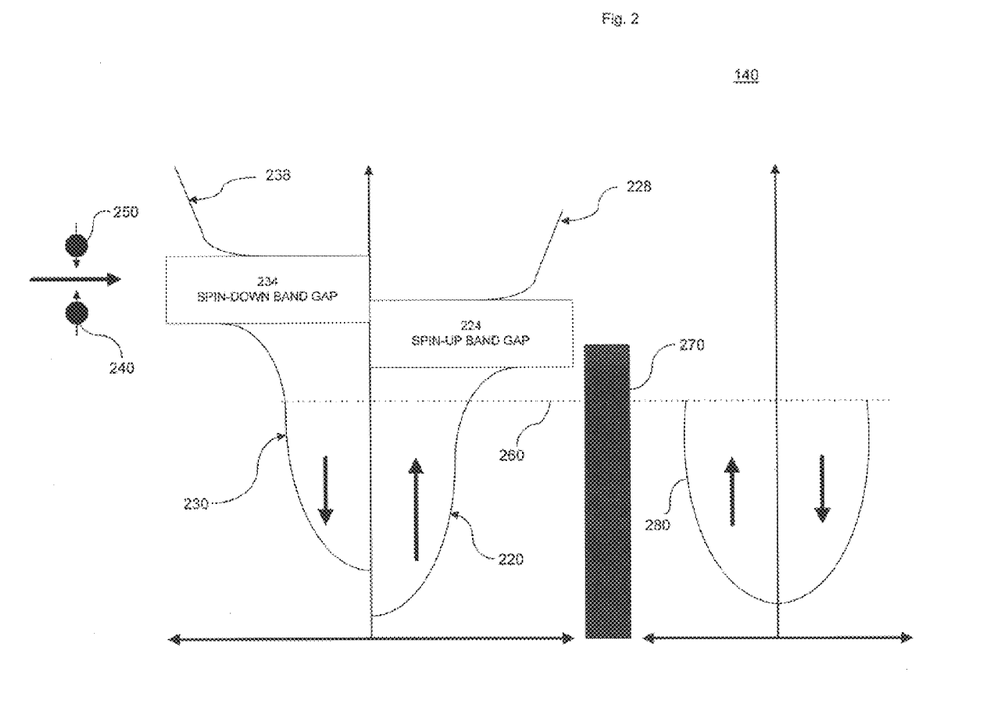
FIG. 2 is a simplified band model illustrating the spin-dependent transmission properties of ferromagnetic materials.

FIG. 2 is a simplified model of the electron energy levels (bands) present in storage medium 140. FIG. 2 includes a simplified band model representation of a ferromagnetic material 200 that is suitable for magnetic layer 144. A tunneling barrier 270 associated with interlayer boundary 146, and a conduction band 280 for non-magnetic, conductive material 148 are also shown.

As is well known, the populations of spin up and spin down electrons are different in ferromagnetic materials. The net magnetization of the magnetic material is determined by which spin state is more populated. An exchange interaction stabilizes electrons in the predominant (majority) spin population and tends to maintain the net magnetization of the material. Changing this net magnetization requires flipping a sufficient number of electron spins to reverse the predominant spin state.

The band model of FIG. 2 represents the allowed energy levels for electrons in ferromagnetic material 200 (vertical axis), as a function of wavenumber, k (horizontal axis). Separate bands 220, 228 and 230, 238 are indicated for spin-up and spin-down electrons, respectively. The vertical offset between bands 220, 228 and 230, 238 indicates the energy difference between the two spin alignment states. Ferromagnetic material 200 has a net magnetization in the spin-up state, because there are more spin up electrons than spin down electrons.

A Fermi level 260 is shown in FIG. 2 to indicate the highest energy level occupied by the electrons of material 200. For transition metals, the conduction band is derived from the partially filled d-orbitals of the component metals atoms, and Fermi level 240 lies within the conduction band, as indicated. The actual band structure for transition metals is more complex than that indicated in FIG. 2, but the simple model suffices for the purpose of this discussion.

A spin-up band gap 224 represents a band of energies between conduction band 220 and another band 228 of allowed energies, from which spin up electrons are excluded. That is, spin up electrons in magnetic material 200 may have energies that fall above or below band gap 224, but they may not have energies that fall within band gap 224. Similarly, spin-down band gap 234 represents a band of energies between conduction band 232 and another energy band 238 from which spin down electrons are excluded. Band model representations of magnetic materials are discussed, for example, in Kittel, "Introduction to Solid State Physics", John Wiley & Sons, New York (1996).

Also shown in FIG. 2 are a spin up electron 240 and a spin down electron 250. The energy with which electrons 240, 250 are incident upon magnetic material 200 is indicated by their position along the vertical energy axis. Spin down electron 250 is incident on magnetic material 200 at an energy that corresponds to band gap 234 for spin down electrons in magnetic material 200. Consequently, spin down electron 250 will be scattered from magnetic material 200 with high probability. On the other hand, this same incident energy places spin up electron 240 at an energy level corresponding to allowed energy band 228, where spin up electron 240 may move freely through magnetic material 200. If magnetic material 200 is deposited on a conductive non-magnetic material, i.e. layer 148, spin up electron 240 may tunnel into layer 148.

A location 160 comprising the magnetic material 200 may store a logical one or a logical zero, by associating each logic state with a spin state. The spin alignment of location 160 may be "read" by illuminating it with a spin-polarized electron beam and measuring the electron current in layer 148. In the system of FIG. 1A, for example, the current may be measured using sense amplifier 170. It is thus a relatively simple process to read the spin state of target location 160.

To write a specific logic state to a target location, the electron optics illuminate the location with a spin-polarized electron beam 112 having properties designed to flip the dominant spin, if necessary, to the appropriate spin state. For example, if spin up represents a first logic state and a second logic state is to be written to the location, the location is illuminated with a spin-polarized electron beam 112 aligned to flip the dominant spin. One factor that determines whether or not the spin state of the location flips is the strength of the coupling between the spin-polarized beam electrons and the target electrons of the dominant spin state of material 200. In particular, the beam electrons should interact with a relatively large portion of the spin up electron population in the magnetic material. Other factors that may contribute to spin flipping include the spin-relaxation time of the material, the spin-dependent tunneling current out of the magnetic material for given target electron energies, and the spin-independent current into the magnetic material.

Figure 3:
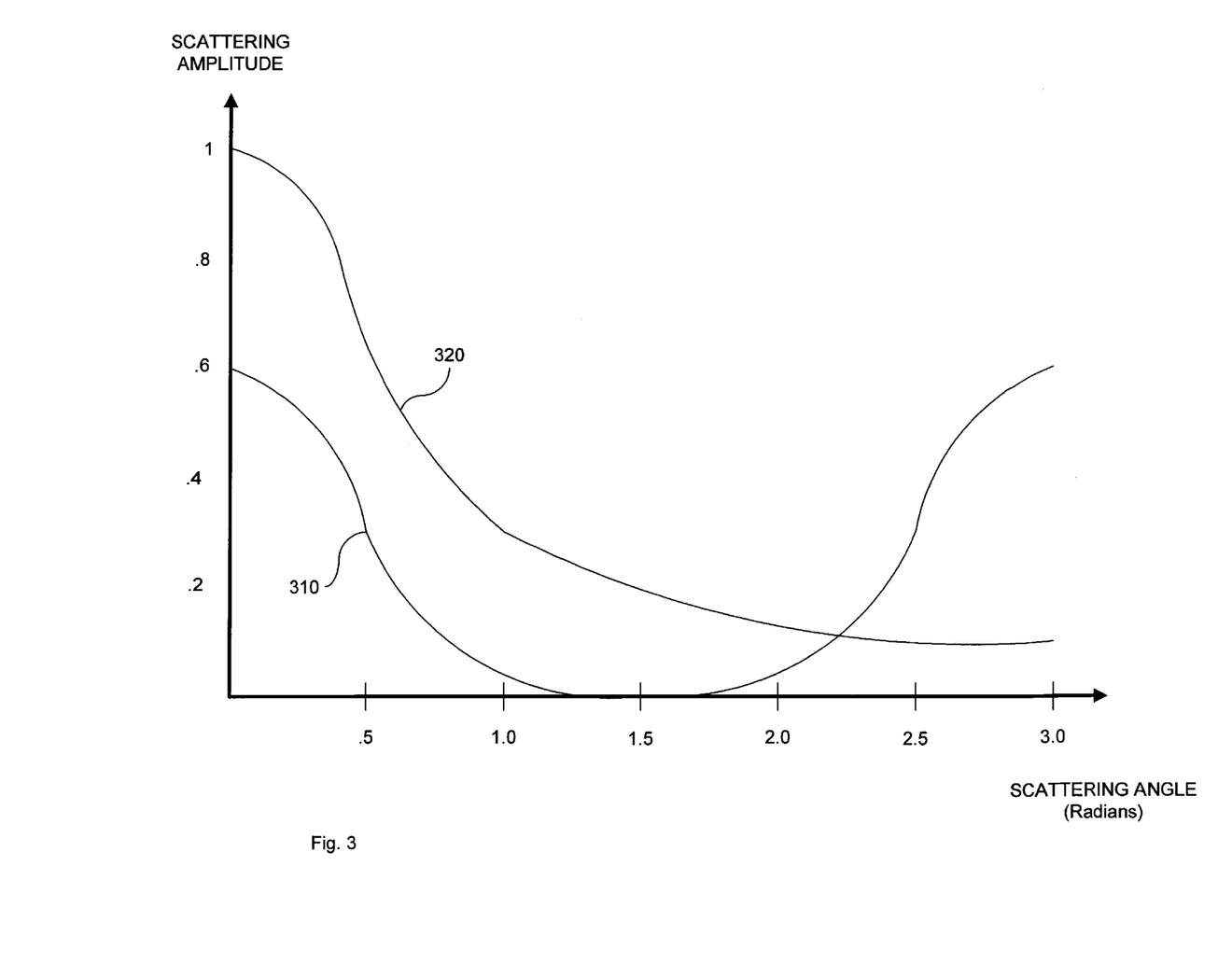
FIG. 3 represents the center of mass scattering amplitudes for electron pairs having parallel and anti-parallel spins.

FIG. 3 represents calculated scattering amplitudes 310 and 320 between electron pairs having parallel spins and electron pairs having anti-parallel spins, respectively. For example, scattering amplitudes 310 and 320 may represent parallel and anti-parallel spin pairings between colliding beam and target electrons, respectively. The Pauli exclusion principle allows the electrons with anti-parallel spin alignments to approach more closely than the electrons with parallel spin alignments. Consequently, the electron pair with anti-parallel spin alignment interact more strongly and their calculated scattering amplitude is correspondingly larger than that determined for the electron pair with parallel spin alignment. In particular, the scattering amplitude at 1.5 radians is much smaller for electron pairs with parallel spin alignments than for those with anit-parallel spin alignments. Scattering angles around 1.5 radians are associated with collisions that transfer energy efficiently from the incident electron of the pair and strongly redirect the electrons' momentum vectors.

The need for strong coupling between the incident electron beam and the target electrons for spin flipping may be illustrated with reference to one proposed mechanism for the spin flip process. Energetic spin-polarized electrons in a first spin state, e.g. spin down, couple preferentially with target electrons in the second spin state, e.g. spin up, as indicated in FIG. 3. This preferential coupling increases the average energy of the spin up target electrons relative to that of spin down target electrons. In effect, the incident spin-polarized electron beam preferentially heats target electrons having the opposite spin state. Provided the coupling is sufficiently strong, each spin down electron in the spin-polarized electron beam may undergo energy-transferring collisions with many tens of spin up target electrons, resulting in significant magnetic gain. An estimate of the number of opposite spin target electrons excited by each spin-polarized electron beam electron is provided by the ratio of the beam electron's kinetic energy to the average thermal energy of the target electrons.

In general, the probability that an electron tunnels through barrier 270 (FIG. 2) increases with the electron's energy. In the above example, this means that the tunneling rate for target electrons to non-magnetic layer 148 increases with the target electrons' energy. Further, the Pauli exclusion principle ensures that the tunneling current to non-magnetic layer 148 includes a larger proportion of spin up target electrons than spin down target electrons when the electron trap is illuminated with spin-down beam electrons. The net effect of preferentially exciting spin up target electrons is a reduction in the population of spin up electrons in the magnetic material through tunneling.

Increased tunneling to the non-magnetic layer also creates a charge imbalance between the magnetic and non-magnetic layers, as the loss of electrons remains uncompensated. The resulting electric field generates a reactive current in which electrons from the non-magnetic layer flow back into the magnetic layer to offset the charge imbalance. The force generated by the electric field that drives the reactive current is independent of spin. That is, while spin up electrons are preferentially "kicked out" of the magnetic layer by the spin down beam electrons, equal numbers of spin up and spin down electrons diffuse back into the magnetic layer.

The net effect of spin-dependent heating and ejection of target electrons followed by a spin-independent reactive current is a reduction in the number of spin up electrons in the magnetic layer relative to the number of spin down electrons. If the coupling is sufficiently strong and the e-beam intensity sufficiently high, the net magnetization of the magnetic material will flip to spin down. A similar mechanism flips a spin-down storage location to a spin-up storage location when the spin-down location is illuminated with a beam of electrons polarized in the spin-up state. The present invention provides a system and method that significantly increases this coupling.

Figure 4A:
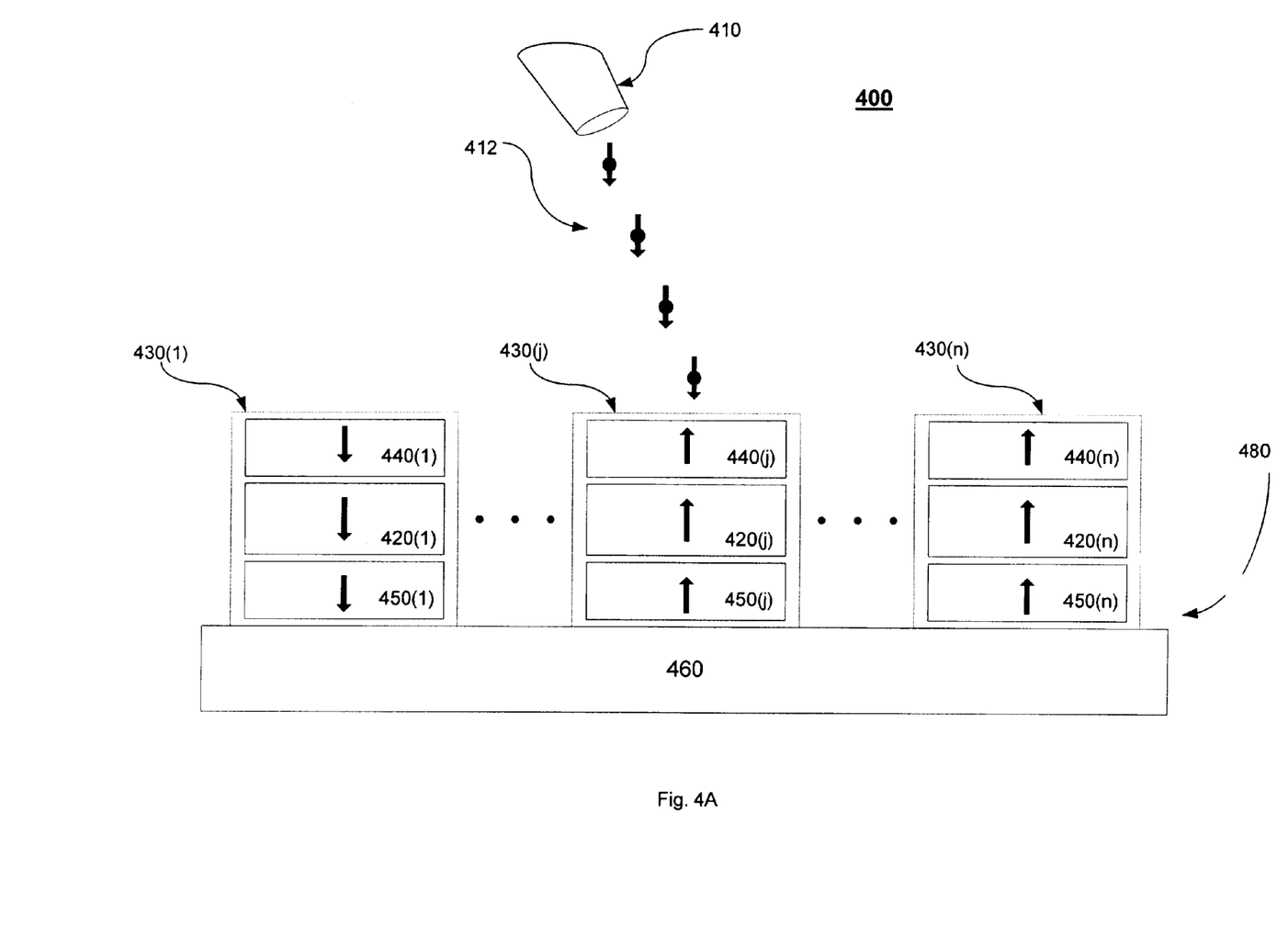
FIG. 4A is a schematic representation of one embodiment of a system including a spin-dependent electron trap in accordance with the present invention.

FIG. 4A is a schematic representation of one embodiment of a storage system 400 in accordance with the present invention. Storage system 400 includes an electron source 410 and a storage medium 480. Electron source 410 provides a beam of spin polarized electrons 412 to a specified location on storage medium 480. Storage medium 480 is represented as an array of spin-dependent electron traps 430(l)–430(n) (generically, "electron trap 430"). While actual systems employ two-dimensional arrays of electron traps 430 as in FIG. 1, a one-dimensional array is shown for purposes of illustration.

Each spin-dependent electron trap 430 comprises a magnetic material 420 sandwiched between first and second spin mirrors 440, 450. In the following discussion, "spin mirror" refers to a magnetically-polarizable material that, for a range of energies, preferentially reflects electrons in one spin state, while transmitting those in the opposite spin state. In the absence of an externally applied force, the spin-state of the mirrors self aligns to the current spin-state of the magnetic material between them. The energies at which this spin-dependent transmission is most pronounced are typically near the Fermi level of electron trap 430, where the incident electron samples the quantum well structure of the electron trap. At energies significantly above the Fermi level, e.g. several electron volts (eV), energy bands are available to transmit electrons in both spin states.

The magnetically-polarizable character of spin mirrors 440, 450 is indicated by the alignment of their spin states with that of the magnetic material 420. The spin-differentiated transmission of a spin mirror may be controlled through the composition of the material or it may be induced by straining a material that does not otherwise exhibit spin-differential transmission.

For the disclosed embodiment of storage medium 480, electron trap 430 is shown deposited on a conductive, non-magnetic layer 460. Spin mirrors 440 and 450 act as spin-dependent mirrors to trap beam electrons 412 having a given spin state within electron trap 430. Trapped beam electrons in the specified spin state have ample opportunity to couple strongly to target electrons in the opposite spin state, as the trapped electrons repeatedly scatter in the magnetic material 420 between layers 440 and 450. As discussed below, non-magnetic layer 460 provides a pathway for electrons that are excited by collisions with the beam electrons to move away from electron trap 430.

Figure 4B:
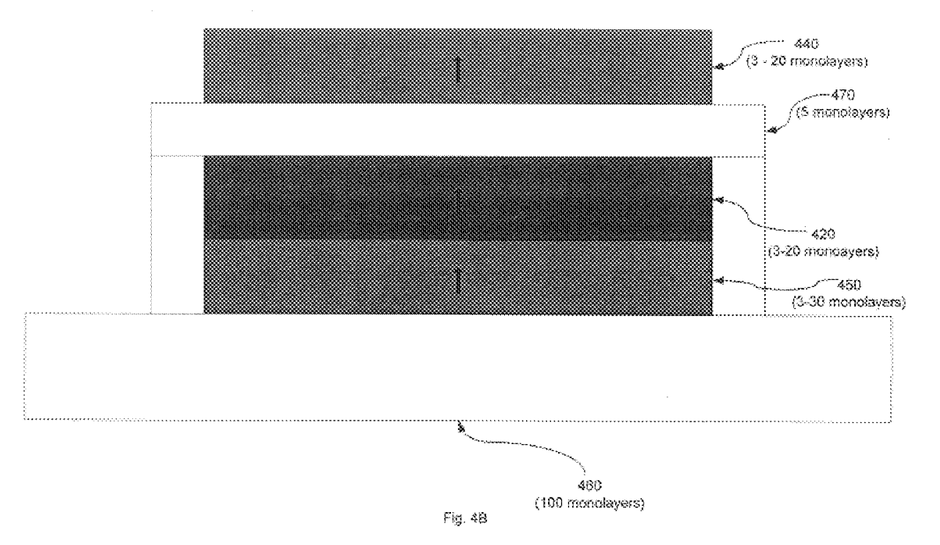
FIG. 4B is a more detailed diagram of one embodiment of the spin-dependent electron trap of FIG. 4A.

FIG. 4B is a block level diagram showing one embodiment of electron trap 430 in greater detail. The disclosed embodiment of electron trap 430 includes a second layer of non-magnetic material 470 between spin mirror 440 and magnetic material 420. The second layer of non-magnetic material 470 is in electrical contact with non-magnetic material 460 to provide an efficient pathway for excited electrons to reach non-magnetic material 460.

Also indicated in FIG. 4B are exemplary thicknesses for the different layers of material. For example, spin mirrors 440, 450 may include between 3 and 20 monolayers of a half metallic material. The thicker structures be used to slow down the incident beam electrons through beam-target collisions. Magnetic material may include 3 to 20 monolayers of a hard magnetic material, depending on the desired direction of magnetic polarization among other things. Non-magnetic materials 450 and 470 may include approximately 100 monolayers and approximately 5 monolayers, respectively, of a non-magnetic material. The thicknesses of these layers may be adjusted to tune the properties of electron trap 430, as discussed below in greater detail.

The number of atomic layers (or monolayers) of magnetic material 420 and spin mirrors 440, 450 may be selected to tune the magnetization properties of electron trap 430. For example, when magnetic material 420 is iron, a thickness of two to four atomic layers may be epitaxially deposited on, e.g. spin mirror 450. Mismatches between the lattice constants of magnetic material 420 and spin mirror 450 create strain in magnetic material 420, which rotates its easy axis of magnetization out of the plane formed by the layer of magnetic material 420.

The thicknesses of spin mirrors 440, 450 and non-magnetic material 470 may also be adjusted to enhance trapping of beam electrons. The absence of spin-dependent reflection for high incident energies allows beam electrons in the spin state that is reflected at lower energies to penetrate electron trap 430. These electrons can subsequently lose energy through collisions with electrons of spin mirrors 440, 450 and magnetic material 420 ("target electrons"). The thicknesses of spin mirrors 440, 450 and/or magnetic material 420 may be adjusted to increase the likelihood that beam electrons undergo enough collisions to reduce their energies to levels at which they can become trapped by spin mirrors 440, 450.

For alternate embodiments of the present invention, additional layers of a material may be deposited on top of spin mirror 440 to increase the scattering probability (and energy loss) of incident beam electrons. For example, 10 to 20 atomic layers (roughly 100 Å) of material may be added to increase the scattering of incident electrons. The additional collisions also tend to impart a momentum component to beam electrons that is transverse to their direction of incidence, distributing them over a wider volume of magnetic material 420. The benefits of this approach are discussed in U.S. patent application Ser. No. 09/211,233 entitled "Quantum Magnetic Memory".

It is well known that electron scattering in solids (metals) has a relatively low probability of altering the spin state of the scattered electrons. The number of momentum-altering collisions is typically orders of magnitude greater than the number of spin flipping collisions per unit time. In addition, the probability that a momentum-altering collision provides a transverse component to an electron's momentum is relatively high. For example, FIG. 3 indicates that a beam electron has about a 50% chance of being scattered 45° or more in the center of mass coordinate system when it collides with an opposite spin target electron. In the laboratory frame of reference, e.g. the frame of reference in which storage medium 480 is represented, the scattering amplitude in the lateral direction remains significant, and multiple scattering events further enhance the probability that a beam electron acquires a lateral momentum component.

Figure 5:
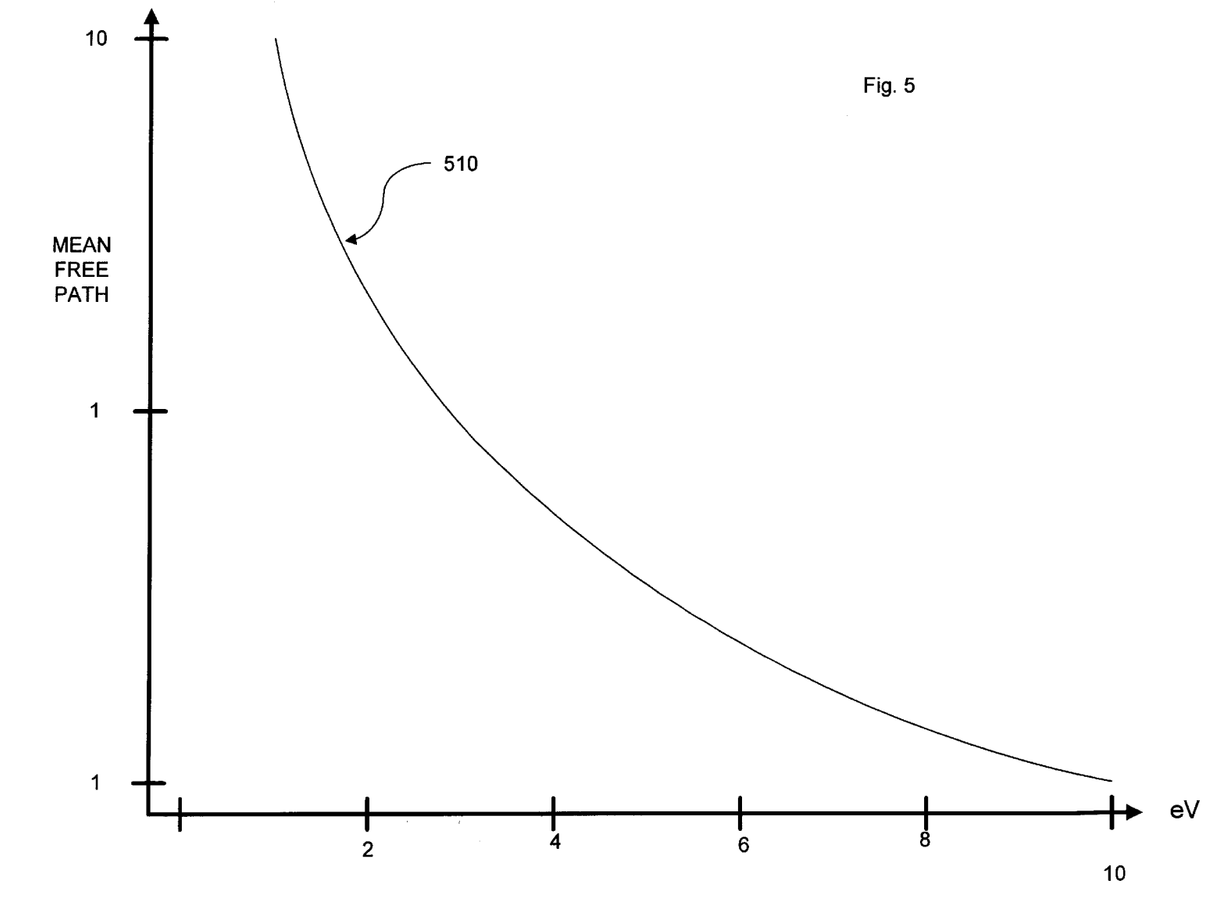
FIG. 5 is a curve representing the mean free path of an electron in a solid as a function of its kinetic energy.

FIG. 5 shows a curve 510 representing the calculated mean free path of an electron in a metal as a function of the electron's kinetic energy. Here, "mean free path" refers to the average distance an electron travels between collisions with other electrons. According to curve 510, an electron's mean free path decreases, and it undergoes more collisions, as its energy increases. In the disclosed system, beam electrons incident on storage material 400 at 10 eVs have on average mean free paths of approximately 0.1 nanometer (1 Å). A 100 Å layer of material 410 (10–20 monolayers) thus provides significant opportunities for lateralizing collisions.

The increase in collision number with increasing energy reflects the larger number of target electrons with which a beam electron can interact as its energy increases. A target electron in the magnetic material can only be scattered to an available, i.e. spin allowed, energy state above the Fermi level, and the beam electron provides the energy for this transition. Higher energy beam electrons can scatter target electrons from energy levels that are further below the Fermi level of the magnetic material than can lower energy beam electrons. Thus, the incident energy of a spin-polarized beam of electrons is another variable that may be tuned to enhance lateral scattering.

Figure 6A:
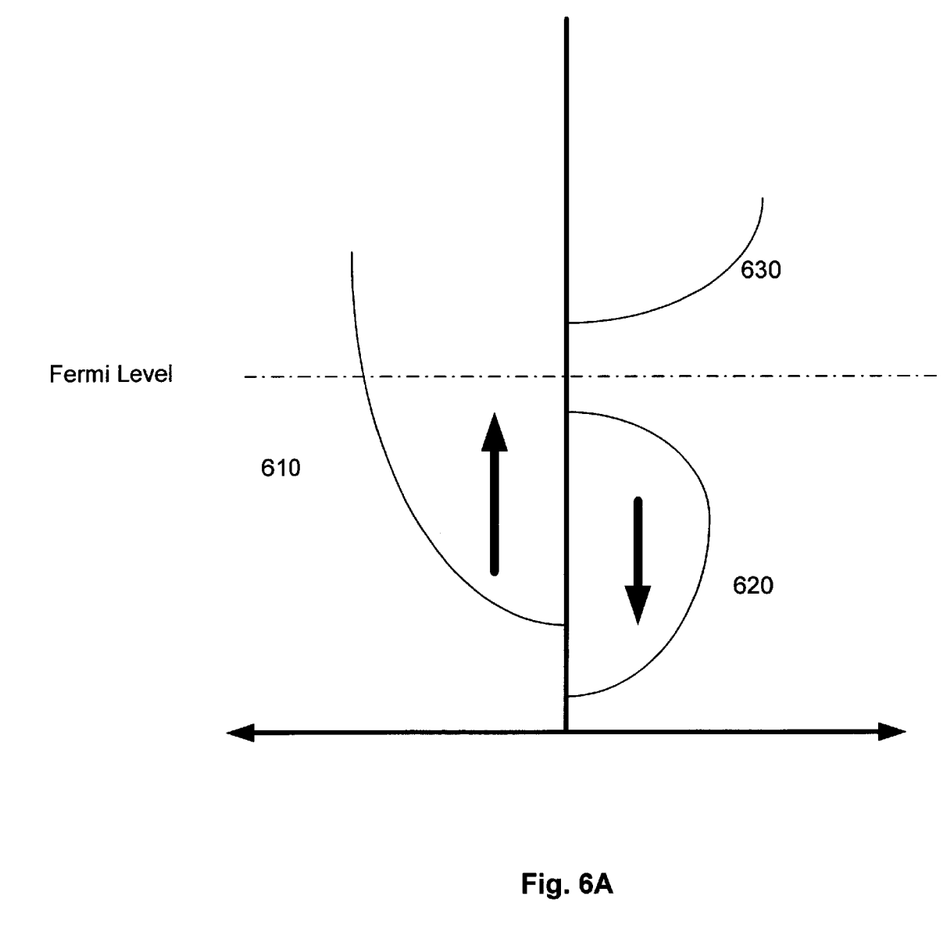
FIG. 6A is a simplified band model of a half-metallic material suitable for use with the present invention.

FIG. 6A is a simplified density of states for a half-metallic material 600 suitable for use as a spin mirror material. Curve 610 represents a distribution of spin-up electrons over available energy states as a function of wavenumber (k), for spin up electrons in half-metal 600. The Fermi level for half-metallic 600 falls within the available energy states represented by curve 610. Consequently, half-metal 600 behaves as a conductor for spin-up electrons.

Curve 620 represents the distribution of electrons over available energy states as a function of k for spin-down electrons in half-metallic material 600. Curve 620 has no energy levels at the Fermi level of material 600. The lowest available energy levels of the next band (curve 630) is shown approximately 0.7 eV above the Fermi level, consistent with band gap values calculated for these materials. Since electrons at room temperature have thermal energies of approximately 0.025 eVs, the 0.7 eV band gap represents a significant barrier to reaching energy levels in which spin-down electrons can move freely through half metallic material 600. Consequently, half-metallic material 600 behaves as an insulator for spin-down electrons.

The band structure of half-metallic materials may be attributable to ferromagnetic coupling. Generally, half-metallic materials behave as conductors for the predominant or majority spin state electrons and as insulators for the minority spin state electrons. For example, half-metallic material 600 may represent spin mirrors 440(j), 450(j) of electron trap 430(j). As noted above, soft magnetic materials and other materials may acquire half-metallic electronic structures similar to that of FIG. 6 through strain-induced perturbations.

Figure 6B:
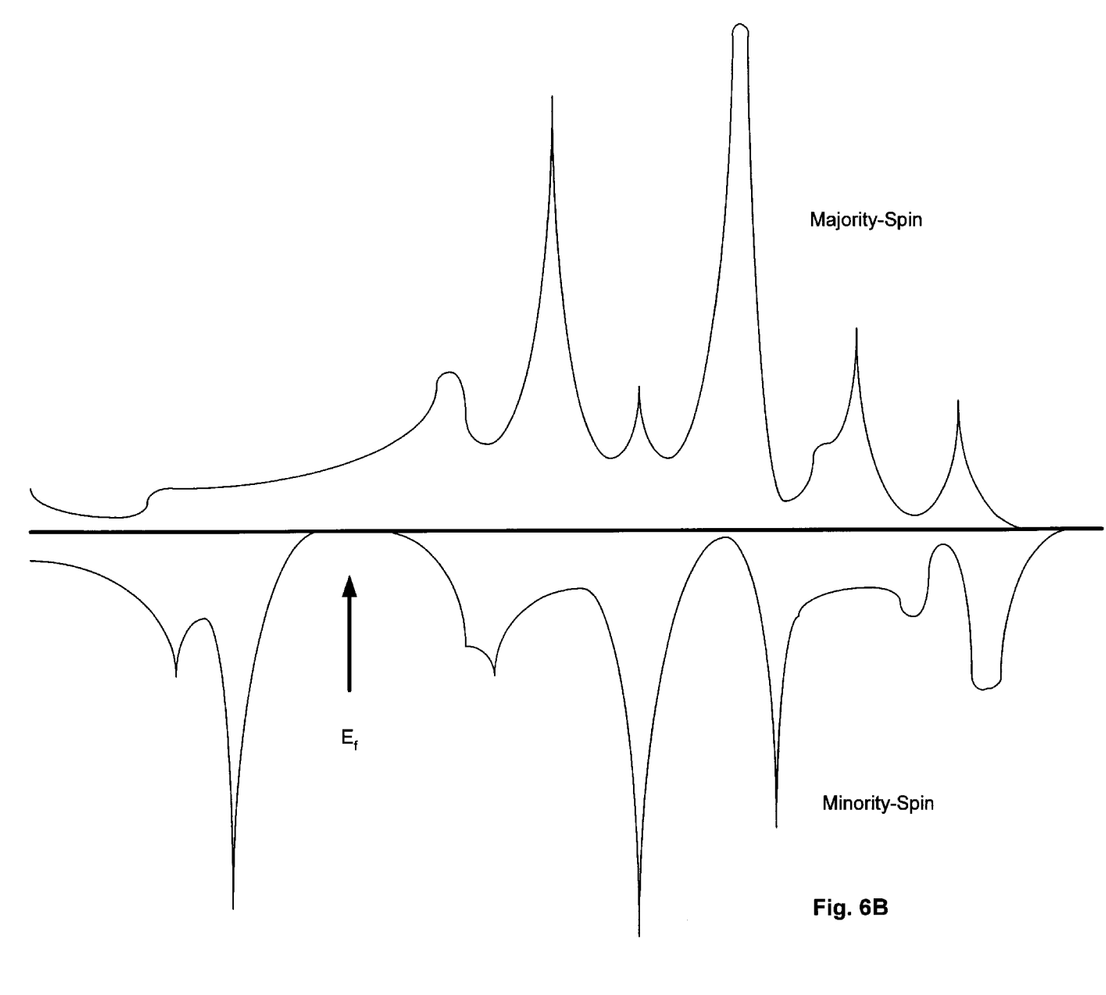
FIG. 6B represents calculated density of states data for the half metallic material NiMnSb.

FIG. 6B represents calculated densities of states for spin up and spin down electrons in the half-metallic material NiMnSb. The location of the Fermi level is indicated by the arrows and the band gap for minority spin electrons around the Fermi level is apparent. Another material expected to exhibit half-metallic behavior is PtMnSb. Generally, materials having narrow bands, energy gaps in their spectra, and strong ferromagnetic interactions may exhibit half-metallic properties. Additional materials and compositions may be coerced into exhibiting half-metallic properties when strained.

The preceding discussion has focused on the spin-dependent electron trapping properties of storage media designed in accordance with the present invention. Various other properties of these storage media and their component electron traps may also effect the media's susceptibility to writing by a spin-polarized electron beam. For example, the electron beam intensity necessary to flip the spin state of a given storage location depends in part on a spin-relaxation time characteristic of the magnetic material. The spin-relaxation time indicates the time necessary to restore the magnetic state of the material when it has been perturbed from an initial state, e.g. by interaction with a spin polarized electron beam. Faster spin-relaxation times make it difficult to flip spin states, because the initial spin state is re-established quickly. Slower spin-relaxation times allow changes in the spin populations of the magnetic material induced by an incident spin-polarized electron beam to persist long enough for spin population inversions (spin flipping) to occur.

Spin-relaxation times depend on the band structure of the magnetic material. For embodiments of the present invention, the spin-relaxation time may be increased by changing the magnetic elements (either in pure or alloyed form) in the magnetic layer. Increasing the spin-relaxation time reduces the spin-polarized current density needed to achieve spin direction reversal.

The dependence of spin-flipping on the various parameters of a quantum magnetic spin system in accordance with the present invention may be represented as follows:

$$e \cdot N_s / T_s < I_{beam} \cdot g_{spin} \quad \text{(I)}$$

Here, $N_s$ is the number of spins per storage location or bit, $T_s$ is the spin-relaxation time, $I_{beam}$ is the electron beam current, e is the electron charge, and $g_{spin}$ is the number of majority electron spins ejected per beam electron, i.e. the gain. Table 1 summarizes the values of the electron beam current necessary to flip the spin of a storage location (bit) for different combinations of, $T_s$ and $g_{spin}$.

TABLE 1

| $T_s/g_{spin}$ | 10 | 20 | 50 | 100 | 200 | 500 | 1000 |
|---|---|---|---|---|---|---|---|
| 1 ps | 1 mA | 500 μA | 200 μA | 100 μA | 50 μA | 20 μA | 10 μA |
| 10 ps | 100 μA | 50 μA | 20 μA | 10 μA | 5 μA | 2 μA | 1 μA |
| 100 ps | 10 μA | 5 μA | 2 μA | 1 μA | 500 nA | 200 nA | 100 nA |
| 1 ns | 1 μA | 500 nA | 200 nA | 100 nA | 50 nA | 20 nA | 10 nA |

In TABLE 1, nA and μA stand for nano Amps and micro Amps, respectively, and ns and ps stand for nano seconds and pico seconds, respectively. The data in TABLE 1 is obtained by assuming a bit (magnetic domain) size of 40 nanometers (nM) on a side that includes 3 atomic layers of Iron (Fe) atoms having a nearest neighbor spacing of $2.48 \times 10^{-10}$ m. With this geometry, each bit contains approximately $1.01 \times 10^5$ atoms.

Equation (I) and the results in TABLE 1 are estimates, but they may be used to illustrate qualitatively the benefits of the present invention. For example, assuming $T_s$ is on the order of 1 ns, a storage location for which $g_{spin}$ is unity would require an electron beam current of approximately 10 μA focused into an area of $1.6 \times 10^{-15}$ m$^{-2}$. The present invention increases $g_{spin}$ by trapping each beam electron for multiple traversals of the magnetic material. Each ten fold increase in $g_{spin}$ reduces the electron beam current necessary to flip the location's spin by an order of magnitude. Thus, when $g_{spin}=100$, a relatively low electron beam current of approximately 100 nA is sufficient to flip the spin of the storage location.

The present invention also provides a relatively easy way to implement read-after-write operations. Read-after-write operations are often used to check that a value has been properly written to a storage location. They are particularly important in databases and other applications in which the integrity of data is of paramount importance.

For storage systems implemented in accordance with the present invention, the transmission/scattering behavior of the incident beam electrons depends sensitively on the state of the storage location being illuminated. The current transmitted through a storage location may be monitored as the storage location is illuminated with the electron beam. As the spin state of a storage location is modified by the electron beam, the transmitted current will change as discussed below.

The impact of storage location spin state on current transmission is illustrated with the following example. A spin-up storage location is illuminated by a spin-down electron beam to convert the storage location to a spin-down state. Initially, the transmission properties of the spin-dependent electron trap that forms the storage location limit the amount of beam current reaching, e.g. conductive layer 460, since spin down electrons will be preferentially trapped by spin mirrors 440, 450. When the spin state of the storage location is flipped to a spin down state by the spin down beam, spin mirrors 440, 450 also flip their spin states, since they are polarized by magnetic material 420. Electrons from the spin-down electron beam are preferentially transmitted through electron trap 430, because they undergo fewer large angle scattering events with the predominantly spin-down target electrons and the availability of spin-down energy bands in the repolarized spin mirrors 440, 450 provide conduction channels to layer 460. By monitoring the transmission of the electron beam as a function of time, the spin-flip can be confirmed by detecting the resulting increase in the transmitted beam current.

There has been disclosed a system and method for reading data from and writing data to a storage medium, using a spin polarized electron beam. The storage medium includes an electron trap formed by a magnetic material sandwiched between spin mirror materials. The spin-mirrors preferentially trap electrons having a spin state opposite to that of the storage location, allowing the beam electrons to undergo multiple collisions with the target electrons. The resulting enhancement in beam-target electron coupling allows the storage location to be written with relatively low intensity spin-polarized electron beams.

The present invention has been illustrated using specific embodiments. Persons skilled in the art and having the benefit of this disclosure will recognize that these embodiments are subject to a variety of modifications that none the less fall within the spirit and scope of the appended claims.

What is claimed is:

1. A system for storing data comprising:
    a source of spin-polarized electrons; and
    a medium, disposed a first distance from the source to interact with the spin-polarized electrons, the medium including a layer of magnetic material sandwiched between first and second layers of spin mirror materials to form a spin-dependent electron trap.

2. The system of claim 1, wherein the first and second layers of spin mirror materials are magnetically polarizable materials.

3. The system of claim 2, wherein the first and second layers of magnetically polarizable materials are first and second layers of a half metal.

4. The system of claim 2, wherein the magnetic material is a hard magnetic material and the first and second layers of spin mirror materials are first and second layers of NiMnSb.

5. The system of claim 1, wherein the magnetic material is a hard magnetic material and the first and second layers of a spin mirror material are first and second layers of a soft magnetic material.

6. The system of claim 5, further including first and second layers of a non-magnetic material between the hard magnetic material and the first and second layers of the soft magnetic material, respectively.

7. The system of claim 1, wherein the spin mirror material is a material having a low density of states for a minority spin state at a Fermi level of the material.

8. A method for switching a magnetic domain from a first spin state to a second spin state, the method comprising:
    directing at the magnetic domain a beam of electrons polarized in the second spin state; and
    trapping a portion of the beam in the magnetic domain between first and second layers of a spin mirror material.

9. The method of claim 8, further comprising stopping the directed beam when the magnetic domain is switched to the second spin state.

10. The method of claim 9, wherein stopping the directed beam comprises:
- monitoring transmission of the directed beam of electrons; and
- redirecting the beam from the magnetic domain when the monitored transmission indicates a change in the magnetic domain from the first to the second spin state.

11. The method of claim 8, wherein trapping a portion of the beam comprises trapping a portion of the beam in the magnetic domain between first and second layers of a half metallic material.

12. The method of claim 8, wherein trapping a portion of the beam comprises trapping a portion of the beam in the magnetic domain between first and second layers of a soft magnetic material.

13. A storage structure comprising an array of magnetic bits, each magnetic bit comprising a hard magnetic material in a first magnetic state sandwiched between first and second layers of a spin-mirror material, the first and second layers of spin mirror material being polarized in the first magnetic state.

14. The storage structure of claim 13, wherein the spin mirror material is a half-metallic material.

15. The storage structure of claim 13, wherein each magnetic cell further comprises a layer of conducting material between the hard magnetic material and one of the layers of half metallic material.

16. The storage structure of claim 13, wherein the spin mirror material is a soft magnetic material.

17. The storage structure of claim 16, wherein each magnetic cell further comprises a layer of conductive, non-magnetic material between the hard magnetic material and the first layer of soft magnetic material.

18. A system for storing data comprising:
- a source of spin polarized electrons;
- a storage medium disposed a selected distance from the source and having a plurality of storage locations, each storage location including a magnetic material sandwiched between first and second spin-mirror materials to preferentially trap electrons of a given spin state near the magnetic material; and
- electron optics to direct the spin polarized electrons to one of the plurality of storage locations.

19. The system of claim 18, wherein the source of spin polarized electrons is an electron micro-channel.

20. The system of claim 18, wherein the first and second spin-mirror materials are a half metallic material.

21. The system of claim 18, wherein the first and second spin mirror materials are soft magnetic materials.

22. The system of claim 18, wherein the first and second spin-mirror materials are formed from strained materials.

* * * * *

UNITED STATES PATENT AND TRADEMARK OFFICE
CERTIFICATE OF CORRECTION

PATENT NO.   : 6,388,912 B1
DATED        : May 14, 2002
INVENTOR(S)  : Hannah et al.

It is certified that error appears in the above-identified patent and that said Letters Patent is hereby corrected as shown below:

<u>Column 1,</u>
Line 41, delete "i.e. a magnetic material" and insert -- i.e., to write data, using electron beams. A typical storage medium includes a relatively thin layer of a magnetic material --.

Signed and Sealed this

Third Day of December, 2002

JAMES E. ROGAN
*Director of the United States Patent and Trademark Office*